United States Patent
Verbrugge et al.

(10) Patent No.: US 9,356,281 B2
(45) Date of Patent: May 31, 2016

(54) INTERCALATION ELECTRODE BASED ON ORDERED GRAPHENE PLANES

(75) Inventors: Mark W. Verbrugge, Troy, MI (US); Xingcheng Xiao, Madison Heights, MI (US); Leonid C. Lev, West Bloomfield, MI (US); Anil K. Sachdev, Rochester Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 978 days.

(21) Appl. No.: 12/123,529

(22) Filed: May 20, 2008

(65) Prior Publication Data

US 2009/0325071 A1    Dec. 31, 2009

(51) Int. Cl.

| | |
|---|---|
| *H01M 4/13* | (2010.01) |
| *H01M 4/00* | (2006.01) |
| *H01M 4/54* | (2006.01) |
| *H01M 4/52* | (2010.01) |
| *H01M 4/133* | (2010.01) |
| *C01B 31/04* | (2006.01) |
| *C30B 25/00* | (2006.01) |
| *C30B 29/02* | (2006.01) |
| *C30B 29/60* | (2006.01) |
| *H01M 4/04* | (2006.01) |
| *H01M 4/1393* | (2010.01) |
| *H01M 4/587* | (2010.01) |
| *H01M 4/66* | (2006.01) |
| *H01M 10/0525* | (2010.01) |

(52) U.S. Cl.
CPC ............... *H01M 4/133* (2013.01); *C01B 31/04* (2013.01); *C01B 31/0423* (2013.01); *C30B 25/00* (2013.01); *C30B 29/02* (2013.01); *C30B 29/60* (2013.01); *H01M 4/0428* (2013.01); *H01M 4/1393* (2013.01); *H01M 4/587* (2013.01); *H01M 4/661* (2013.01); *H01M 10/0525* (2013.01); *Y02E 60/122* (2013.01)

(58) Field of Classification Search
None
See application file for complete search history.

(56) References Cited

U.S. PATENT DOCUMENTS

| | | | |
|---|---|---|---|
| 4,863,818 | A | 9/1989 | Yoshimoto et al. |
| 6,884,545 | B2 | 4/2005 | Fukuda et al. |
| 6,982,132 | B1 * | 1/2006 | Goldner et al. ............... 429/162 |
| 7,776,445 | B2 | 8/2010 | Lee et al. |
| 2004/0197641 | A1 * | 10/2004 | Visco et al. ................... 429/137 |

(Continued)

FOREIGN PATENT DOCUMENTS

JP    2008056546 A  *  3/2008

OTHER PUBLICATIONS

Mingyao Zhu, A mechanism for carbon nanosheet formation, Jun. 27, 2007, Carbon, vol. 45, 2229-2234.*

(Continued)

*Primary Examiner* — Daniel Gatewood
(74) *Attorney, Agent, or Firm* — Reising Ethington P.C.

(57) ABSTRACT

An intercalation electrode includes an electron current collector and graphene planes deposited normal to the surface of the current collector substrate. The graphene planes are deposited on the current collector substrate from a carbon-precursor gas using, for example, chemical vapor deposition. In an embodiment of an anode for a lithium-ion battery, the graphene planes are intercalated with lithium atoms. A lithium-ion battery may include this anode, a cathode, and a non-aqueous electrolyte. In repeated charging and discharging of the anode, lithium atoms and ions are readily transported between the graphene planes of the anode and the electrolyte.

11 Claims, 4 Drawing Sheets

(56) References Cited

U.S. PATENT DOCUMENTS

| | | |
|---|---|---|
| 2005/0260453 A1* | 11/2005 | Jiao et al. .................... 428/698 |
| 2006/0035148 A1* | 2/2006 | Balaya et al. ............... 429/218.1 |
| 2007/0015029 A1 | 1/2007 | Budinski et al. |
| 2007/0031317 A1* | 2/2007 | Akamatsu et al. ......... 423/447.1 |
| 2007/0111106 A1* | 5/2007 | Kim et al. .................... 429/324 |
| 2008/0247938 A1* | 10/2008 | Tsai et al. .................. 423/447.2 |
| 2009/0258164 A1 | 10/2009 | Nakai et al. |

OTHER PUBLICATIONS

Gao, B., Electrochemical intercalation of single-walled carbon nanotubes with lithium, Feb. 1999, Chemical Physics Letters, 307, 153-157.*

Zhu et al., A mechanism for carbon nanosheet formation; Carbon 2007; vol. 1. 45, pp. 2229-2234.

PCT International Search Report for application No. PCT/US2009/043282 dated Jun. 14, 2010; PCT Written Opinion of the International Search Authority for application No. PCT/US2009/043282 dated Jun. 14, 2010.

Bruno Scrosati; Recent advances in lithium ion battery materials; Electrochimica Aeta 45 (2000) 2461-2466.

Wu Yuping et al.; Lithium ion battery—application and practice; Chemical Industry Publishing House, 1st Edition, 2004, pp. 54-55 and second paragraph p. 64 and Fig. 3-26(b).

* cited by examiner

INTERCALATION ELECTRODE BASED ON ORDERED GRAPHENE PLANES

TECHNICAL FIELD

This disclosure pertains to electrode material comprising ordered graphene planes for intercalation with an electrode material such as lithium in preparing a rechargeable anode for lithium-ion battery applications. This disclosure also pertains to a method of growing graphene planes generally perpendicular to a current collector surface in preparing such an intercalation/de-intercalation electrode.

BACKGROUND OF THE INVENTION

Lithium-ion batteries are secondary (rechargeable) energy storage devices that are useful in laptop computers, power tools, and other portable devices that can use a source of relatively low potential electrical energy. Lithium-ion batteries are also being developed for automotive applications.

In a common embodiment, a lithium-ion battery cell comprises an anode (in the battery discharge mode the anode is the negative electrode) of lithium-intercalated graphite particles. Graphite is characterized by planes of strongly bonded carbon atoms, and with weaker bonding between the planes. Thus, lithium atoms are dispersed and diluted between the planes of carbon atoms in the graphite particles. These lithium-intercalated graphite particles may be deposited and bonded on a metal current collector substrate. The anode material is in contact with an electrolyte of a lithium salt, such as lithium hexafluorophosphate, dissolved in a non-aqueous solvent of mixed organic carbonates such as ethylene carbonate and dimethyl carbonate. The electrolyte, in turn, contacts a cathode of a composition, such as a transition metal oxide or phosphate, which accepts lithium ions transported from the anode through the electrolyte during discharge of the battery. When the lithium-ion cell is recharged, lithium ions are transported from the cathode through the electrolyte and intercalate into the graphite particles.

Such lithium intercalated anodes are commonly made by ball milling graphite particles in a low-boiling solvent (e.g., xylene) with a polymeric binder material (e.g., EPDM or PVDF) and a conductive additive (e.g., carbon black). The graphite-containing mixture is then solvent cast on a copper, nickel, or stainless steel current collector foil to form an anode assembly. During the operation of the lithium-ion battery cell, lithium is intercalated between the carbon planes of the graphite as lithium atoms. During discharge of the battery, lithium atoms in the anode are oxidized to lithium ions ($Li^+$) which migrate from the graphite lattice, enter the electrolyte and flow into the cathode. The freed electrons from the oxidized lithium atoms enter the current collector and an external electrical load circuit, giving rise to current that can provide useful work (e.g., power an electric motor). The presence of an inactive binder and the substantially random alignment of the graphite particles on the anode current collector do not necessarily provide an efficient anode construction relative to the architecture we describe herein.

It is recognized that the atomic structure and organization of the anode in a lithium-ion cell plays a role in lithium-transport efficiency of the cell and its ability to experience repeated charges and discharges. There is a need for improved lithium-ion cell anode structures and a related and broader need to otherwise improve electrodes comprising metal ion intercalated carbon electrodes.

SUMMARY OF THE INVENTION

A focus of one embodiment is on the construction of a planar carbon electrode structure that enables efficient and repeated transport of metal atoms/ions into and out of the planes of the carbon electrode structure. A timely need for such a structure is as a lithium intercalated, planar carbon anode for a lithium-ion battery. In a lithium-ion battery, the anode material experiences repeated charging and discharging in which lithium atoms and ions must move into and out of the planar graphene layers.

While graphite particles comprise planes of carbon atoms, the organization and orientation of the carbon atoms varies within and between graphite particles. It is now found that the structure and orientation of the planar carbon layers is important in the efficiency of the movement of the lithium. Premade particles or flakes of graphite that are intercalated with lithium and simply applied to a current collector surface do not necessarily provide an efficient anode structure.

Graphene is now recognized as a more or less idealized arrangement of carbon atoms in a single planar sheet of $sp^2$-bonded carbon atoms in large array of hexagonal clusters, like atomic-scale chicken wire. In accordance with embodiments of this invention, a metallic electron collector substrate for an electrochemical cell electrode is selected and prepared, and graphene planes are formed in situ on a surface of the collector material. The graphene planes may be formed by deposition of carbon atoms from a gaseous carbon-precursor material such as, for example, methane or acetylene. Chemical vapor deposition practices, compositions, and apparatus are usually suitable for the growth of graphene planes, side-by-side, and generally perpendicular to the metallic electron collector substrate. This organized arrangement of graphene planes perpendicular to the electron collector plate provides an electrode structure for efficient transport of metal atoms and ions between the electrode and a complementary electrolyte.

The current collector substrate for an electrode in a lithium-ion battery may be, for example, copper, nickel, or stainless steel. The current collector substrate is placed in a chemical vapor deposition chamber for the growth of graphene normal to the current collector substrate. A suitable carbon-precursor gas may, for example, comprise a mixture of methane (as the precursor material) diluted with hydrogen and argon to provide a non-oxidizing atmosphere. Carbon deposition and graphene plane formation on the metal substrate is often obtained at gas and chamber temperatures of about 300° C. to about 600° C. The decomposition of carbon-containing precursors can be achieved by high temperature generated by a hot filament. Also, the decomposition of carbon precursor gas can be achieved by forming plasma generated with microwave, direct current, or radio frequency. Carbon deposition is conducted to obtain the formation of graphene planes extending upwardly from and generally perpendicular to the collector surface. The graphene planes may extend upwardly on end to 100 μm or so from the collector surface.

Sometimes the selected current collector metal inherently promotes or catalyzes the decomposition of the carbon-precursor gas and the deposition of carbon atoms in graphene planes generally perpendicular to the metal electron-collector surface. Where a selected collector metal, such as copper, does not readily promote the decomposition of (for example) methane, a thin deposit of clusters of atoms (or a thin layer) of a transition metal such as nickel, iron, cobalt, platinum, or their alloys may be pre-deposited on the copper surface to serve as a catalyst. An ordered graphene planar anode structure is then formed by chemical vapor deposition that is enhanced by this catalyst deposit. Subsequent insertion or intercalation of lithium in the parallel planes of the graphene matrix is efficient and involves the formation of some electron bonding between the lithium and the intercalation host. The resulting electrode is dense, of increased volumetric efficiency relative to the conventional particulate-based electrode described previously, and more efficient because electronically insulating polymeric binders are not required; this latter attribute also leads to a cost reduction through reduced material utilization.

In some embodiments of the invention, a thin layer of silver, gold, or alloys thereof is deposited over the current collector substrate to provide a bondable ductile interface between the current collector and edges of graphene planes. The graphene planes may be formed directly on this ductile metallic interlayer, or promoted by a thin catalytic deposit of nickel, iron, cobalt, platinum, or their alloys over the ductile metallic layer. In one embodiment, after the graphene layers have been formed, the total coated electrode may be heated in vacuum or in inert gas such as argon to enable melting and/or softening of the layer of silver, gold, or their alloys, to allow this layer to flow around the edges of the graphene planes to bond the graphene planes to the current collector substrate surface. A silver layer is especially ductile and will expand as the graphene planes separate to receive lithium atoms or another intercalated material for an electrode. At the same time, the thin layer of silver, gold or their alloys can reduce the contact resistance between graphene layer and current collector in the case of the formation of amorphous carbon at the early stage. The reheating step also serves to anneal any defects present in the graphene layers in addition to the enhanced bonding due to the wetting of the graphene junctions with silver, gold, or their alloys.

This ordered graphene structure may be used in lithium-ion cells comprising any compatible electrolyte composition and cathode composition. And the ordered graphene structure may be used as an electrode material in other electrochemical cells to receive other intercalated materials, such as supercapacitors.

Other objects and advantages of the invention will be apparent from the following description of preferred embodiments.

DESCRIPTION OF PREFERRED EMBODIMENTS

Figure 1:
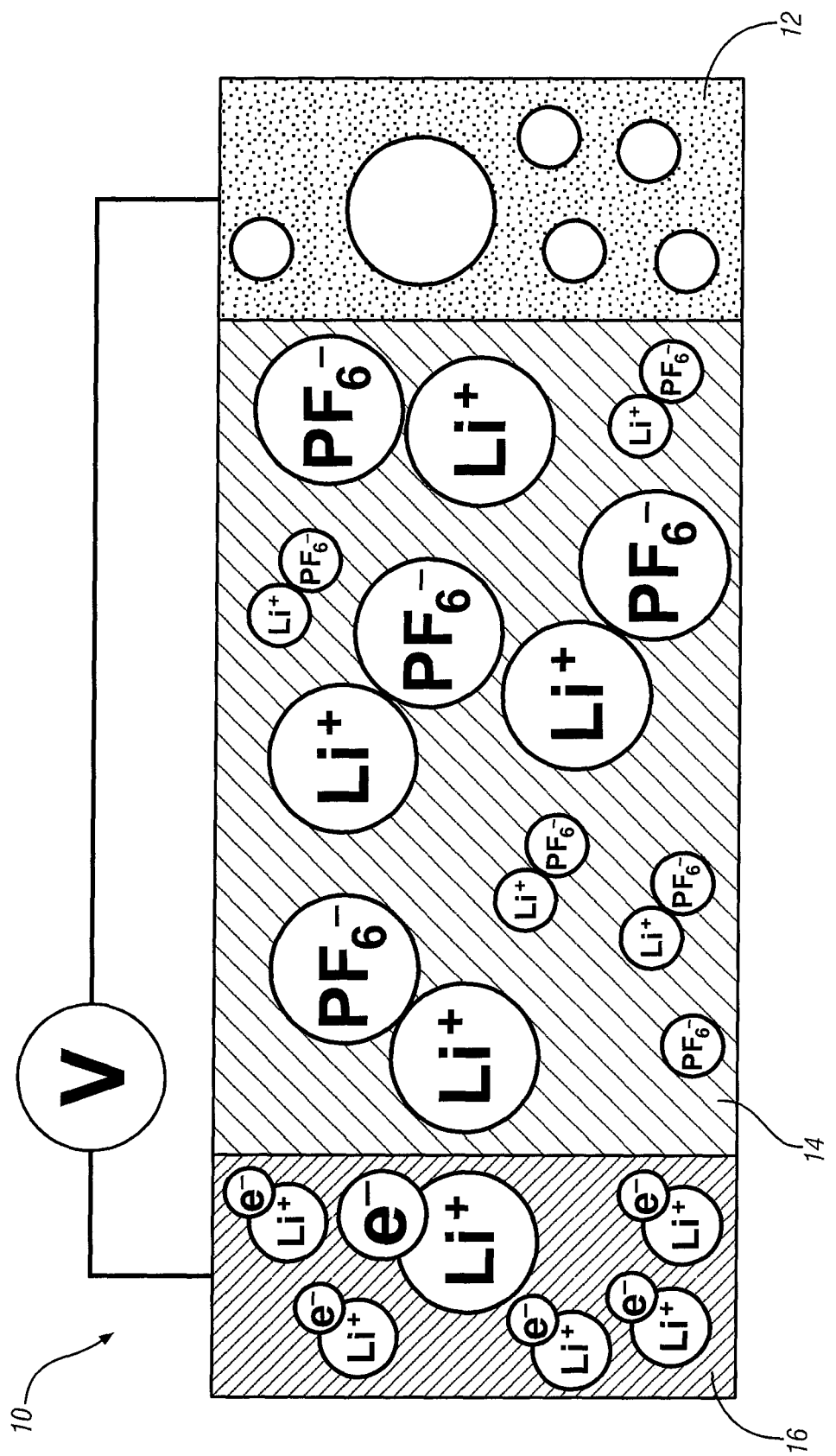
FIG. 1 is a schematic illustrating a lithium-ion cell in accordance with one embodiment of the invention. In this illustration a cell is shown in a discharged state.

This invention provides an electrode including graphene planes positioned normal to a current collector for use as an electrode in an electrochemical cell. The organized graphene planes provide a structure for an intercalated element in the cell. Referring to FIG. 1, in one embodiment of the invention the graphene electrode structure serves as an anode in a lithium-ion battery cell 10, which includes a first electrode 12, an electrolyte 14, and a second electrode 16. The first electrode 12 may be an anode and the second electrode 16 may be a cathode. Embodiments of the invention will be illustrated in the context of a lithium-ion battery cell. In FIG. 1 the lithium-ion battery cell 10 is illustrated in a discharged state, therefore, anode 12 is shown devoid of lithium ions. The electrolyte 14 is illustrated as a suitable electrolyte material comprising lithium ions and hexafluorophosphate ions. The lithium ions have been transported into cathode 16 during discharge of the battery. Discharge occurs by transport of electrons through the external circuit. The electrolyte 14 may be, for example, a lithium salt, such as lithium hexafluorophosphate ($LiPF_6$), dispersed in a non-aqueous organic material which may be a liquid, gel, or polymer. For example, the lithium salt may be dissolved in a solvent of mixed organic carbonates such as ethylene carbonate and dimethyl carbonate. Sometimes the electrolyte uses a gel to contain or constitute the electrolyte and sometimes the electrolyte includes a conductive polymer or lithium conducting ceramic. In the lithium-ion battery, any suitable cathode material may be used. The cathode 16 is often a composition (such as a transition metal oxide or phosphate) that can accept lithium ions transported from the anode through the electrolyte during discharge of the battery. Examples of lithium-based insertion cathode materials include $LiFePO_4$, $LiMn_2O_4$, $LiCoO_2$, and $Li_2FeSiO_4$. In FIG. 1, the anode 12 maybe a lithium-intercalated graphene electrode as will be more fully described herein.

Figure 2:
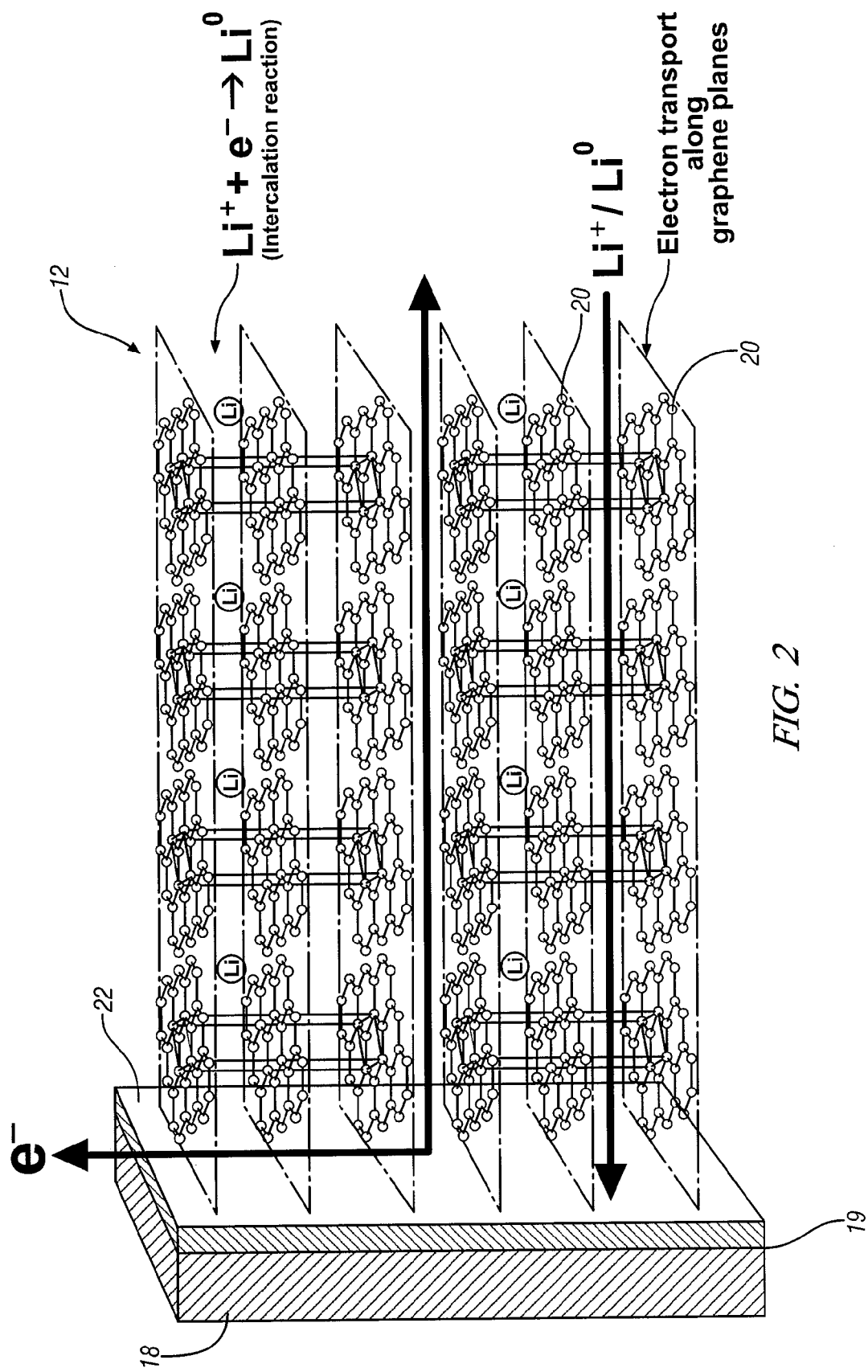
FIG. 2 is a schematic illustrating a portion of a current collector substrate of an electrode with several enlarged graphene layers normal to the current collector in accordance with one embodiment of the invention. The planes of carbon atoms are spaced with lithium atoms between the planes. An optional layer of silver, gold, or their alloys is positioned over the current collector. Directional arrows indicate a flow of electrons in the current carrier when lithium atoms are oxidized to lithium ions, and a flow of lithium ions out of the graphene electrode into an adjacent electrolyte (not shown).
Figure 5:
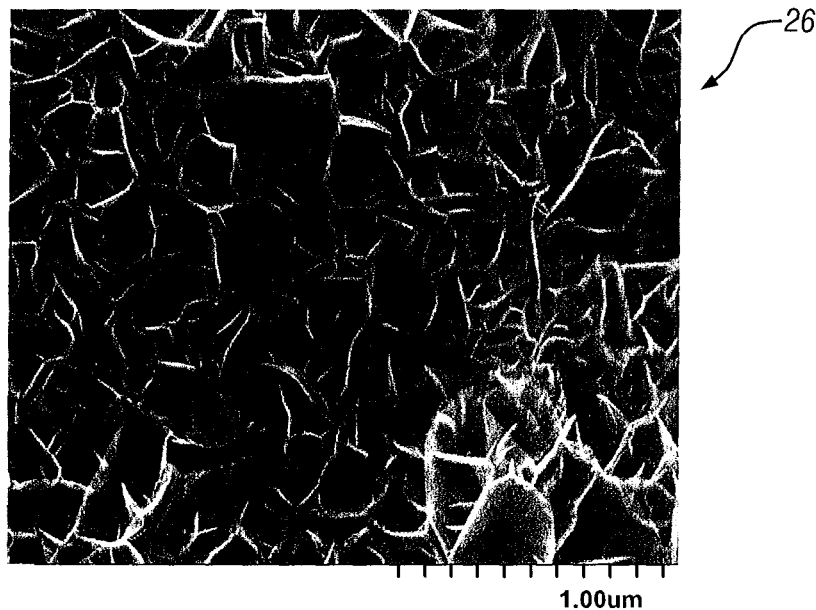
FIG. 5 is a plan view scanning electron micrograph (SEM) of an ordered electrode of vertically aligned graphene layers consistent with one embodiment of the invention.

Referring to FIG. 2, a portion of the lithium-ion cell electrode 12 is schematically illustrated with an electron current collector 18. Current collector 18 is suitably provided in the form of a strip or foil of a size and shape for a specific anode design. The current collector 18 includes an electrode surface region 19. As illustrated in FIG. 2, several graphene planes 20 have been formed in situ on a surface of current collector 18 and perpendicular to the surface. For simplicity of illustrations, the graphene planes 20 are illustrated in FIG. 2 as being generally parallel to each other. Although they are formed perpendicular to the current collector 18, the graphene planes 20 may not be parallel, as is illustrated in the SEM of FIG. 5. The graphene planes 20 are formed over a predetermined area of current collector 18 for providing a specified electron current flow and lithium-ion transport in the electrode structure.

The current collector 18 may be formed, for example, of a metal such as copper (Cu), nickel (Ni), or stainless steel (SS) that provides suitable electron conductivity for the electrode 12. A lithium-ion battery may comprise several such electrodes 12 arranged in series and/or parallel electrical connection to provide a desired electrical potential and power.

In the embodiment of FIG. 2, a ductile metallic layer 22 has been deposited on the current collector 18 as a connective base layer for securing graphene planes 20. The ductile metallic layer 22 is optional and may comprise, for example, silver, silver alloy, gold, or gold alloy. The initial thickness of the ductile metallic layer 22 may be in the range of about 10 nm to about 10 μm. In another embodiment, the initial thickness of the ductile metallic layer may about 20 nm to about 300 nm. After the graphene planes 20 have been formed over the ductile metallic layer 22 by deposition and organization of carbon atoms, the ductile metallic layer 22 may be heated to a softening temperature of the silver, gold, or their alloys to enable the liquid metal to flow around and wet the graphene planes 20 at their base, and after re-cooling of the ductile metallic layer 22, secure adjacent edges of the graphene planes 20. The planar dimension of graphene planes 20 extending from current collector 18 (and ductile metallic layer 22 in this embodiment) may be about 100 nm to about 100 μm.

In the preparation of an electrode for the lithium-ion cell 10, for example the cell 10 illustrated in FIG. 1, lithium atoms are intercalated between graphene planes 20. The spacing between graphene planes 20 is inherently sufficient to accommodate the transport of lithium atoms and lithium ions ($Li^+$) into and out of the organized graphene plane structure. Lithium atoms may be intercalated into a newly formed electrode structure 12 by placing the electrode into contact with a lithium-ion containing electrolyte and applying a cell-charging potential to the assembly. In the intercalation (or cell charging) reaction, lithium ions are reduced to lithium atoms as illustrated in the equation: $Li^+ + e \rightarrow Li^0$. The lithium atoms are transported into the graphene electrode structure and find separated and electronically stabilized positions between the graphene planes 20. When the electrode structure 12 in an operating lithium-ion cell 10 is subjected to a cell discharge reaction, lithium atoms are oxidized to lithium ions which are transported from between the perpendicular graphene planes 20 into the contiguous electrolyte 14 (not shown in FIG. 2) as indicated by the horizontal and coplanar directional arrow in FIG. 2. The lithium-ion cell 10 of FIG. 1 is in the discharged condition. Electrons released by oxidation of the lithium atoms in the electrode are transported along the graphene planes 20, through the ductile metallic layer 22, and to and along the current collector 18 as indicated by the e-directional arrow in FIG. 2. Thus, the electrode structure of FIG. 2 comprising many graphene planes 20 generally perpendicular to current collector 18 provide easy and repeatable flow paths for lithium atoms and lithium ions in the cycling of a lithium-ion battery.

In a similar manner the combination of electron current collector 18 and graphene planes 20 may be used for the like transport of other metal atoms and metal ions in a different electrochemical cell.

Figure 3:
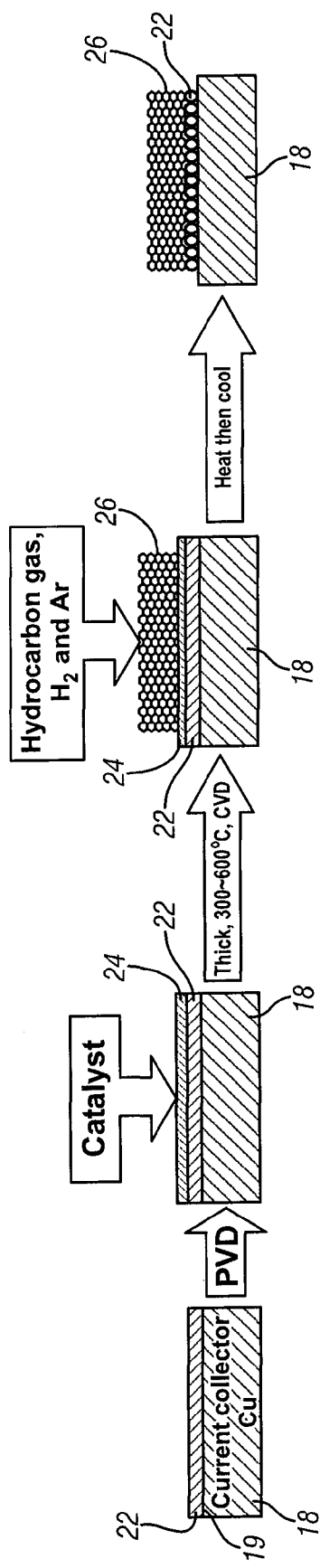
FIG. 3 is a process flow diagram illustrating a process of manufacturing a graphene electrode structure using a copper current collector in accordance with one embodiment of the invention.

FIG. 3 shows a flow diagram for a method of making an electrode, for example the electrode illustrated in FIG. 2 with the current collector 18 being copper and the ductile metallic layer 22 being silver. The relatively high electron conductivity of copper makes it an option for the current collector 18 in the lithium-ion cell 10.

In the embodiment of FIG. 3, the ductile metallic layer 22, for example a layer of silver about 300 nm thick, was applied to the electrode surface region 19 of the copper current collector 18. The ductile metallic layer 22 may be applied by electrodeposition, vapor deposition, or the like, in a suitable thickness to serve as a fusible bonding layer for the graphene electrode material to be subsequently formed on the current collector 18. In other embodiments the ductile metallic layer 22 may be an alloy of silver, gold, or an alloy of gold.

In the method according to one embodiment it is desired to decompose a carbon precursor, such as methane, or acetylene, in a chemical vapor deposition process for forming graphene planes on the current collector surface. The decomposition of carbon precursors can be achieved by high temperature provided by a hot filament, plasma generated with microwave, direct current, or radio frequency. But the copper surface may not be a particularly effective surface for such decomposition and deposition. Accordingly, a transition metal catalyst 24 may first be deposited over the ductile metallic layer 22 of the current collector 18 by a physical vapor deposition practice such as by sputtering or by e-beam evaporation or chemical vapor deposition with transition metal containing precursors. Thus the transition metal catalyst 24 may be the outermost layer of the current collector substrate 18. The transition metal catalyst 24 may be iron (Fe), nickel (Ni), cobalt (Co), platinum (Pt), or their alloys. For example, a suitable iron specimen is used in the sputtering or e-beam deposition process. In one embodiment, the transition metal catalyst 24 may be a layer with controlled thickness. For example, the thickness may be in the range of 20 nm to 300 nm, preferably about 30 nm to about 50 nm. In one embodiment, the transition metal catalyst 24 is discontinuous. For example, the transition metal catalyst 24 may include islands of about 20 to 1000 nm across.

Still referring to FIG. 3, the catalyst-coated current collector may then be placed inside a chemical vapor deposition chamber and graphene layers or planes 26 are grown over the current collector 18 with $CH_4$ (or $C_2H_2$, $C_3H_6$, or other hydrocarbon gas), $H_2$, and Ar as the precursors (with optimum ratio) in a temperature range of about 300° C. to 600° C. If the transition metal catalyst 24 is too thin, for example less than 20 nm, carbon nanotubes may form instead of graphene. Preferably, a graphene coating thickness of about 50 nm to about 300 nm is deposited. The graphene planes 26 are formed generally perpendicular to the surface of the current collector 18. The two right-most illustrations in FIG. 3 illustrate the CVD-formed graphene planes 26 (greatly enlarged for illustration) formed on the copper current collector 18.

At the completion of graphene deposition, the entire current collector-graphene electrode body may be placed in a vacuum or in an inert gas atmosphere and heated, for example above about 950° C., to melt and/or soften the ductile metallic layer 22. As shown in FIG. 3, the ductile metallic layer 22 may then flow around the attached ends of the deposited graphene layers 26 to wet and improve the adhesion of the base of the graphene layers 26 to the current collector substrate 18. The transition metal catalyst 24 may merge with the ductile metallic layer 22. Then the electrode is cooled. Upon cooling, the graphene planes are anchored in the ductile metallic layer 22 as illustrated schematically in the right-most illustration of FIG. 3. The soft and fusible metallic layer 22 provides a bonding interface between the current collector 18 and the graphene planes 26. For example, since silver has high ductility, it can absorb the approximately 11% growth that occurs when lithium intercalates into the graphene planes. In addition, the contact resistance to electron flow between graphene layers 26 and current collector substrate 18 can be reduced.

Figure 4:
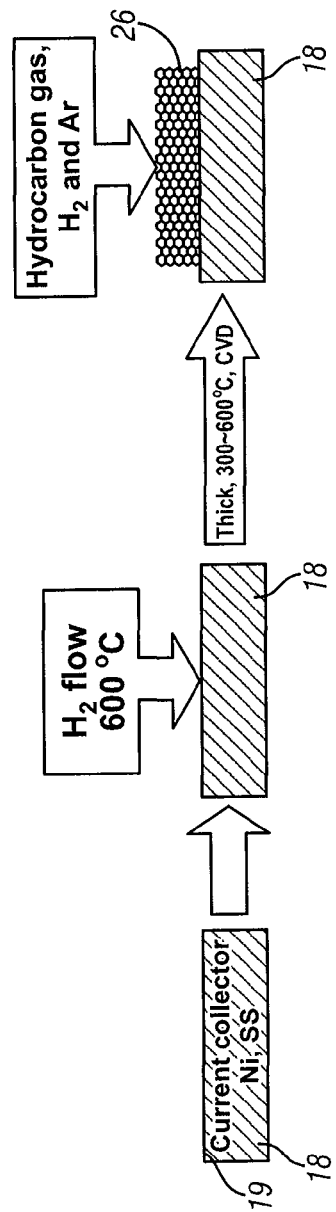
FIG. 4 is a process flow diagram illustrating a process of manufacturing a graphene electrode structure using a nickel or stainless steel current collector in accordance with another embodiment of the invention.

Referring to FIG. 4, a method of making the electrode 12 when the current collector 18 is nickel or stainless steel is shown. When the current collector 18 is nickel or stainless steel, the surface is typically suitable for the deposition of graphene planes 26 and the catalytic layer 24 is not required. In one embodiment, the nickel or stainless current collector substrate 18 is pre-treated by annealing in hydrogen flow to reduce any oxide at the electrode surface region 19. Such an oxide may inhibit the desired deposition of carbon atoms and their formation of graphene planes 26. The reduction of the oxide layer will be conducted out in the hydrogen flow at a temperature of about 600° C. in the same chemical vapor deposition chamber that will be used for the formation of graphene planes 26. Then the graphene layers 26 are grown on the current collector 18, as described above, with $CH_4$ (or $C_2H_2$, $C_3H_6$, or other hydrocarbon gas), $H_2$, and Ar as the precursors (with optimum ratio) in a temperature range of about 300° C. to 600° C. The right-most illustration in FIG. 4 illustrates the CVD-formed graphene planes 26 (greatly enlarged for illustration) formed on the nickel or stainless steel current collector 18. Optionally (not shown), the ductile metallic layer 22 may be formed on the nickel or stainless steel current collector 18 before the annealing. At the completion of graphene deposition, the entire current collector-graphene electrode body may be placed in a vacuum or in an inert gas atmosphere and heated to melt and/or soften the ductile metallic layer 22, then cooled, as described above for FIG. 4.

FIG. 5 is a plan view scanning electron micrograph (SEM) of an ordered graphite electrode consistent with one embodiment of the invention. The image of FIG. 5 looks down on graphene layers 26 formed on a substrate to simulate a current collector. The alignment is not as idealized as in FIG. 2, but the vertical edges of the graphene planes are perpendicular to the substrate. The graphene planes 26 are uniquely presented for intercalation with lithium ions for a lithium battery electrode or with other metal ions in a different intercalation electrode embodiment. The graphene layers were prepared in a microwave plasma enhanced chemical vapor deposition (MWPECVD) system available from AsTex HPM/M, Applied Science and Technology, Inc., Woburn, Mass. Acetylene (40 sccm) and hydrogen (60 sccm) were chosen as the precursors. The deposition pressure was 40 Torr and the growth temperature was 800° C. The substrates were either single side polished silicon wafers or graphite plates. The SEM scans were performed in a LEO 230 field emission SEM (FE-SEM) with accelerating voltage of 5 kV. Transmission Electron Microscopy (TEM, JEOL 2010) with accelerating voltage of 200 kV was employed to characterize the nanostructure of carbon films.

Figure 6:
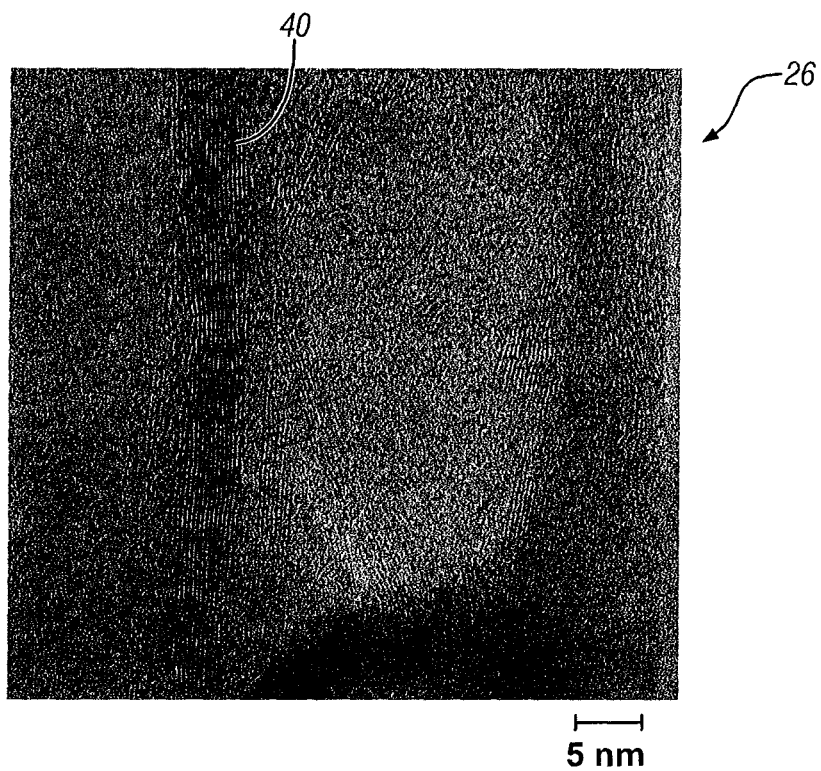
FIG. 6 is a high-resolution transmission electron micrograph (TEM) of an ordered electrode in accordance with an embodiment of the invention. The thin, parallel, herring bone-like lines in the TEM show that the graphene planes are oriented normal to the substrate surface.

FIG. 6 is a high resolution transmission electron microscope (TEM) image of the top surfaces of graphene layers 26 formed on a current collector as described above. The vertical edges 40 of the graphene layers 26 are identified in the photograph of FIG. 6. Again the vertical edges 40 of such structured graphene planes 26 present themselves for efficient intercalation/de-intercalation with lithium or other metal in the operation of an electrode material.

After the graphene planes 26 are formed according to the method described above, the graphene planes 26 are intercalated with lithium ions. For example, the graphene surface of an electrode is covered with a porous separator material whose pores are filled with an intended electrolyte. Then a cathode (in this intercalation electrode example) is placed on the remaining surface of the separator opposite the anode. As illustrated, current collectors come with the electrodes. The cell is now sealed. On a first electrolytic cycle of the cell, lithium stored in the cathode is driven to the anode for the first charge cycle. The cell may then be discharged and re-charged through repeated cycles. Of course, one or more such cells may be combined (stacked) in the formation of a secondary battery.

The electrode of this invention with graphene planes normally requires no binder or conductive diluents. The lithium-ion battery with graphene planes normal to the electrode surface may result in lower cost ($/kW and $/kWh) and higher performance (kW/kg and kWh/kg) of the battery.

Practices of the invention have been shown by examples that are presented as illustrations and not limitations of the invention.

The invention claimed is:

1. A method of making a negative electrode that intercalates and deintercalates lithium during charging and discharging, respectively, for a lithium-ion electrochemical cell, the method comprising:
   providing a metallic foil comprising an electrode surface region;
   forming a ductile metallic layer onto the electrode surface region;
   directly growing graphene planes onto the ductile metallic layer generally perpendicular to the electrode surface region and coextensive with the electrode surface region by chemical vapor deposition of a gas composition comprising carbon-precursor molecules, wherein an electrically insulating polymeric binder and conductive diluents are not included along with the graphene planes
   heating the ductile metallic layer to above 950° C. after the graphene planes have been formed on the ductile metallic layer to flow and wet the ductile metallic layer around edges of the graphene planes;
   cooling the ductile metallic layer to bond the edges of the graphene planes to the ductile metallic layer; and
   intercalating lithium into the graphene planes.

2. A method as recited in claim 1 wherein the carbon-precursor molecules are at least one of $CH_4$, $C_2H_2$, or $C_3H_6$, and wherein the chemical vapor deposition is conducted in a temperature range of 300° C. to 600° C.

3. A method as set forth in claim 1 wherein the metallic foil comprises one of copper, nickel, or stainless steel.

4. A method as recited in claim 1 wherein the ductile metallic layer comprises at least one of silver or gold or their alloys.

5. A method as recited in claim 1 wherein the ductile metallic layer has an initial thickness of about 10 nm to about 10 μm.

6. A method as recited in claim 3 wherein the metallic foil comprises copper, and further comprising depositing a transition metal catalyst over at least a portion of the electrode surface region prior to forming the graphene planes.

7. A method as recited in claim 6 wherein the transition metal catalyst comprises one of Fe, Ni, Co, Pt, or their alloys.

8. A method as recited in claim 6 further comprising:
   forming a ductile metallic layer onto the electrode surface region of the copper foil before forming the graphene planes;
   depositing the transition metal catalyst onto at least a portion of the ductile metallic layer;
   forming the graphene planes onto the ductile metallic layer;
   heating the ductile metallic layer to above 950° C. after the graphene planes have been formed on the ductile metallic layer to flow and wet the ductile metallic layer around edges of the graphene planes; and
   cooling the ductile metallic layer to bond the edges of the graphene planes to the ductile metallic layer.

9. A method as recited in claim 6 wherein the transition metal catalyst is discontinuous.

10. A method as recited in claim 9 wherein the transition metal catalyst comprises islands of about 20 to 1000 nm across.

11. A method as recited in claim 3 wherein the current collector substrate comprises one of nickel or stainless steel that does not include a catalyst on the electrode surface region, and further comprising annealing the current collector substrate in hydrogen flow prior to forming the graphene planes.

\* \* \* \* \*